Figure 1:
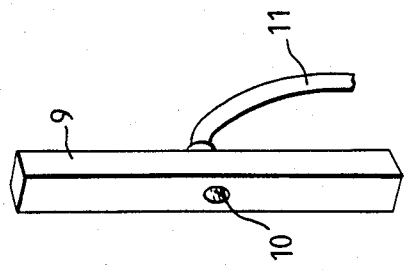
Figure 1:
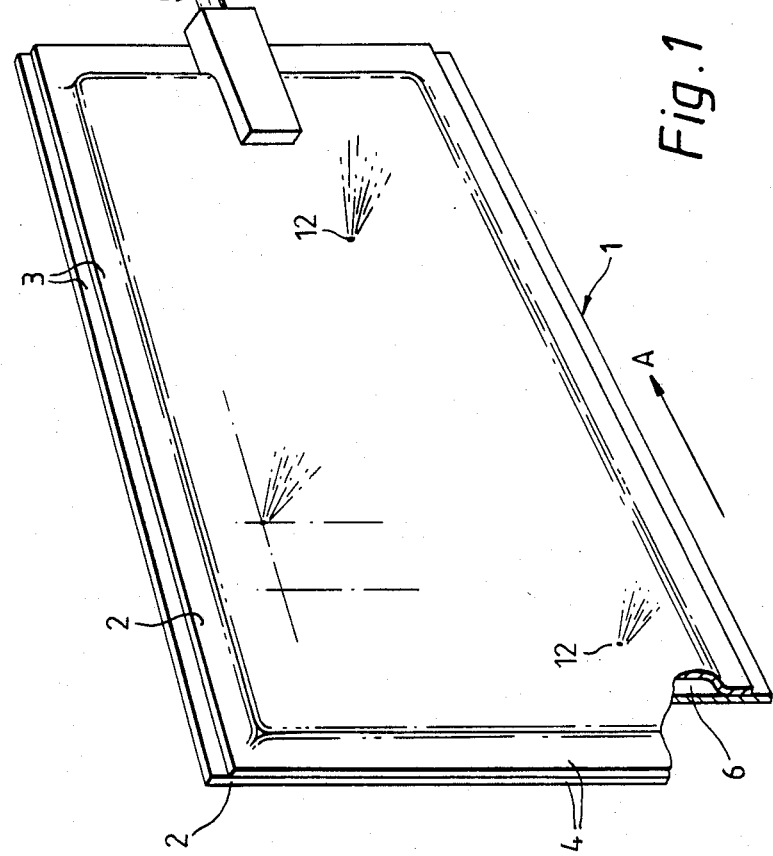

United States Patent [19] [11] Patent Number: 4,498,118
Bell [45] Date of Patent: Feb. 5, 1985

[54] CIRCUIT BOARD INSTALLATION
[75] Inventor: David L. Bell, Winchester, England
[73] Assignee: BICC-Vero Electronics Limited, Merseyside, England
[21] Appl. No.: 482,143
[22] Filed: Apr. 5, 1983
[51] Int. Cl.³ .............................................. H05K 7/20
[52] U.S. Cl. ........................... 361/384; 165/DIG. 11; 62/418; 361/383; 361/415
[58] Field of Search ............................... 361/382–385, 361/413, 415; 174/16 R; 62/414, 418; 165/80, DIG. 11

[56] References Cited
U.S. PATENT DOCUMENTS

| 3,168,818 | 2/1965 | Weber | 62/414 |
| 3,626,251 | 12/1971 | Vigue | 361/384 |
| 4,399,485 | 8/1983 | Wright | 361/384 |
| 4,447,856 | 5/1984 | Takahashi | 62/418 |

OTHER PUBLICATIONS

High Capacity Power Dissipation Semiconductor Package, Doo, IBM Tech. Discl. Bull., vol. 21, No. 5, Oct. 1978, pp. 1898, 1899.

Primary Examiner—G. P. Tolin
Attorney, Agent, or Firm—Buell, Ziesenheim, Beck & Alstadt

[57] ABSTRACT

In a circuit board installation in which circuit boards are slidably mounted in opposed guide rails of a rack in a cabinet, an efficient and relatively inexpensive flat cooling module is slidably mounted in opposed guide rails between two circuit boards. The cooling module comprises a pair of flat side walls spaced apart and sealed together around their edges to form a sealed chamber, an inlet port in the cooling module connected to a source of pressurized cooling fluid and, in each of the side walls, mutually spaced orifices in which nipples may be fitted and through which pressurized cooling fluid is directed towards components of the adjacent circuit boards.

7 Claims, 2 Drawing Figures

CIRCUIT BOARD INSTALLATION

This invention relates to cabinets, cases and other enclosures including racks for accommodating circuit boards. Such racks generally comprise pairs of opposed guide rails into which edges of a circuit board can be slid from the front of the rack and edge connectors at the rear of the rack which co-operate with connectors mounted on the rear edges of circuit boards that have been slid into opposed guide rails of the rack. A cabinet or other enclosure including a rack accommodating circuit boards will hereinafter, for convenience, be referred to as a "circuit board installation of the kind described".

The development of silicon chips has resulted in a substantial increase in the component density of individual circuit boards of a circuit board installation of the kind described and the increased component density of each circuit board of the installation has resulted in a greater power output and hence higher operating temperatures.

Conventional methods of controlling the temperature of the enclosure of a circuit board installation of the kind described include normal convection, forced convection, e.g. fan cooling, liquid cooling, various forms of heat sink, and a combination of two or more of these methods but all of these known methods are unsatisfactory because they are inefficient and/or expensive to operate.

It is an object of the present invention to provide, in a circuit board installation of the kind described, an improved cooling system which is efficient and avoids wastage of space within the enclosure of the installation.

In the improved circuit board installation in accordance with the invention, at least one substantially flat cooling module is slidably mounted in opposed guide rails of the rack adjacent a circuit board or circuit boards, which cooling module comprises a pair of substantially flat side walls spaced apart and sealed together around their peripheral edges to form a sealed chamber, at least one inlet port connected or adapted to be connected to a source of pressurised cooling fluid and, in one or each of the side walls, a plurality of orifices through which pressurised cooling fluid is directed towards components of an adjacent circuit board of the installation.

The orifices in one or each side wall may each be a simple hole or, in some circumstances, in each of at least some of the orifices in one or each side wall a nipple may be inserted for directing a jet or spray of cooling fluid in a particular direction. The positions of the plurality of orifices in one or each side wall of the cooling module are conveniently determined by use of grid markings similar to those on a standard card employed to determine the positions of components on an adjacent circuit board.

Preferably, the or each inlet port is located at the rear edge of the cooling module and a self-sealing connector may be secured in the inlet port.

The source of pressurised cooling fluid may be housed in the enclosure of the circuit board installation but, preferably, it is positioned externally of the enclosure. The cooling fluid may be maintained at any desired pressure, temperature and humidity. As the cooling fluid, it is preferred to employ compressed air or any other gas that will not have any deleterious effect on the components and materials of the circuit boards.

If desired, the chamber of the substantially flat cooling module may be subdivided by internal barrier walls into a plurality of interconnecting passages through which pressurised cooling fluid is caused to flow and, in the region of each of at least some of the orifices in one or each side wall, the cross-sectional area of the associated passage may reduce gradually so that cooling fluid is directed from the orifice at a substantial pressure.

The invention also includes, for use in a circuit board installation of the kind described, a substantially flat cooling module as hereinbefore described.

Figure 2:
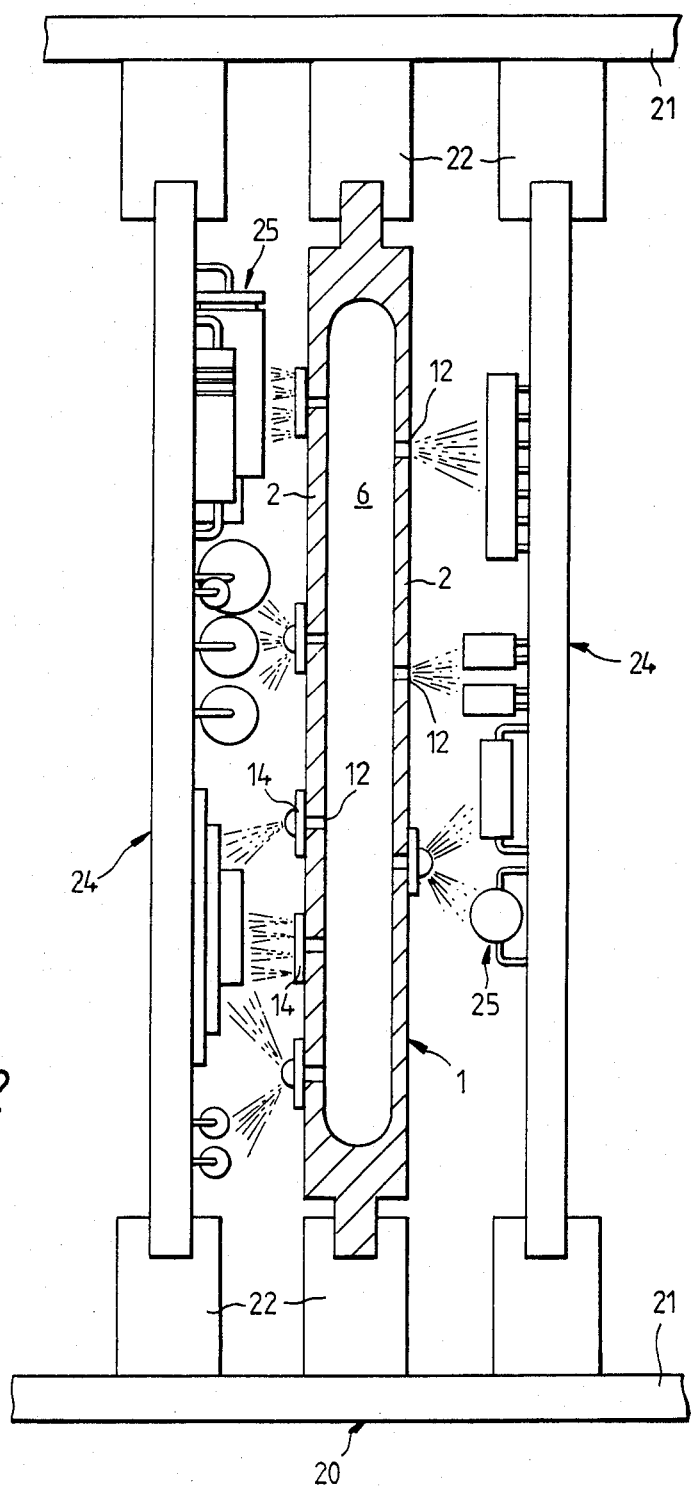

The invention is further illustrated by a description, by way of example, of a preferred circuit board installation of the kind described with reference to the accompanying diagrammatic drawings, in which:

FIG. 1 is an exploded perspective view of a preferred substantially flat cooling module of the circuit board installation, and FIG. 2 is a fragmental sectional end view of the cooling module shown in FIG. 1 looking in the direcion of arrow A and two adjacent circuit boards of the circuit board installation.

Referring to the drawings, the substantially flat cooling module 1 shown in FIG. 1 comprises two rectangular side panels 2 which, over a major proportion of their surface areas longitudinally extending marginal portions 3 and transversely extending marginal portions 4 are recessed in such a way that when the two panels are sealed together along their marginal portions, they define between them a chamber 6. As will be seen, major portions of the external surfaces of the panels 2 are substantially flat. A self-sealing connector 8 is secured to the rear end of the module 1 and provides an inlet port to the chamber 6. When the cooling module 1 is mounted in the cabinet of a circuit board installation, the self-sealing connector 8 will pass through an aperture 10 in a vertical tie bar 9 at the rear of the cabinet for connection to an air hose 11 extending to a source of compressed air (not shown). Each panel 2 has a plurality of orifices 12 through which compressed air introduced through the self-sealing connector 8 into the sealed chamber 6 can be directed towards components of an adjacent circuit board, the positions of the orifices in each panel having been determined by use of grid markings similar to those on a standard card employed to determine the positions of components of an adjacent circuit board. As will be seen on referring to FIG. 2, each of some of the orifices 12 may have fitted in it a nipple 14 for directing a jet or spray of compressed air in a particular direction.

In the circuit board installation shown in FIG. 2, circuit boards 24 carrying components generally indicated by the reference 25 are slidably engaged in opposed upper and lower guide rails 22 of a rack 21 mounted in a cabinet 20. Positioned between the circuit boards 24 and slidably engaged in upper and lower guide rails 22 of the rack 21 is a cooling module 1 of the kind shown in FIG. 1. Compressed air introduced into the sealed chamber 6 of the cooling module 1 through the self-sealing connector 8 is directed through the orifices 12 in each side panel 2 and, when present, through nipples 14 fitted in some of the orifices, towards components 25 of each circuit board 24 to ensure that the components of the circuit board installation are not subjected to an undesirable high temperature.

The improved cooling system of the circuit board installation is effective and avoids unnecessary wastage of space within the cabinet of the installation.

What I claim as my invention is:

1. A circuit board installation comprising a cabinet, at least one rack in the cabinet having opposed guide rails and, slidably mounted in said opposed guide rails, a plurality of circuit boards, wherein at least one substantially flat cooling module is slidably mounted in said opposed guide rails of the rack adjacent at least one circuit board, which cooling module comprises a pair of substantially flat side walls spaced apart and sealed together around their peripheral edges to form a sealed chamber, at least one inlet port in the cooling module connected to a source of pressurised cooling fluid and, in at least one of the side walls, a plurality of orifices through which pressurised cooling fluid is directed towards components of an adjacent circuit board of the installation.

2. A circuit board installation as claimed in claim 1, wherein the positions of at least some of the plurality of orifices in at least one side wall of the cooling module substantially correspond to the positions of components on an adjacent circuit board.

3. A circuit board installation as claimed in claim 1, wherein, in each of at least some of the orifices in at least one side wall of the cooling module, a nipple is inserted for directing a jet or spray of pressurised cooling fluid in a particular direction.

4. A circuit board installation as claimed in claim 1, wherein the inlet port is located at the rear edge of the cooling module.

5. A circuit board installation as claimed in claim 1, wherein a self-sealing connector is secured in the inlet port.

6. A circuit board installation as claimed in claim 1, wherein the source of pressurised cooling fluid is housed externally of the cabinet.

7. A circuit board installation as claimed in claim 1, wherein the cooling fluid is a gas that will not have any deleterious effect on the components and materials of the circuit boards.

* * * * *

UNITED STATES PATENT AND TRADEMARK OFFICE
CERTIFICATE OF CORRECTION

PATENT NO. : 4,498,118
DATED : February 5, 1985
INVENTOR(S) : DAVID LESLIE BELL

It is certified that error appears in the above-identified patent and that said Letters Patent is hereby corrected as shown below:

Column 2, line 28, after areas, insert --between--.

Signed and Sealed this

Sixth Day of August 1985

[SEAL]

Attest:

DONALD J. QUIGG

Attesting Officer

Acting Commissioner of Patents and Trademarks